United States Patent [19]

Farrall

[11] Patent Number: 4,893,048

[45] Date of Patent: Jan. 9, 1990

[54] MULTI-GAP SWITCH

[75] Inventor: George A. Farrall, Rexford, N.Y.

[73] Assignee: General Electric Company, Schenectady, N.Y.

[21] Appl. No.: 252,623

[22] Filed: Oct. 3, 1988

[51] Int. Cl.⁴ .............................................. H01L 41/08

[52] U.S. Cl. .................................... 310/331; 200/181; 310/332

[58] Field of Search ................................ 310/330–332, 310/328, 321, 323; 200/181

[56] References Cited

U.S. PATENT DOCUMENTS 4,595,855 6/1986 Farrall ................................ 310/332
4,620,123 10/1986 Farrall et al. .................... 310/332 X
4,620,124 10/1986 Farrall et al. ....................... 310/332
4,654,555 3/1987 Ohba et al. .......................... 310/332
4,670,682 6/1987 Harnden, Jr. et al. ............. 310/332
4,689,517 8/1987 Harnden, Jr. et al. ............. 310/332
4,697,118 9/1987 Harnden, Jr. et al. ............. 310/331
4,742,263 5/1988 Harnden, Jr. et al. ............. 310/331

*Primary Examiner*—Mark O. Budd
*Attorney, Agent, or Firm*—Robert Ochi; James C. Davis, Jr.; Marvin Snyder

[57] ABSTRACT

A power switch which comprises a plurality of contact pairs connected in series provides substantial operational advantages. Included in these advantages are fast operating speed and direct imposition of circuit opening. The individual contact pairs are preferably controlled by piezoelectric benders to provide a compact, lightweight switch.

21 Claims, 7 Drawing Sheets

(SHOWN UPSIDE DOWN RELATIVE TO FIGURE 1 VIEW)

MULTI-GAP SWITCH

BACKGROUND OF THE INVENTION

1. Field of the Invention

The present invention relates to the field of electric power switches, and more particularly, to the field of light, fast acting switches.

2. Prior Art

Electrical switches come in many different configurations. In general, switches include a fixed contact and a movable contact. When the fixed and movable contacts are in contact, the circuit controlled by the switch is closed. To open the circuit, the movable contact is actuated or withdrawn away from the fixed contact. When current is flowing in the circuit at the time the switch is opened, an arc develops across the contacts as the switch opens. This arc is extinguished by a variety of different mechanisms, depending on switch design. In some switches designed for AC use, this arc extinguishes in the vicinity of the next zero crossing of the current waveform as a consequence of the arc current reducing to a value at which the arc becomes unstable. It is an inherent property of arcs that when the arc current becomes small enough, an instability develops and the arc extinguishes. In some devices such as those used to interrupt DC currents which have no zero crossings, the arc is intentionally lengthened to render it unstable. Such lengthening causes the arc voltage to increase about 30 volts for each centimeter increase in arc length where the contacts are disposed in an air atmosphere at normal atmospheric pressure. This is added to the voltage drop of the electrodes which is always present and may range from about 10 volts to about 30 volts depending upon what materials are present in the electrodes. The source voltage which serves to drive current through the circuit to be interrupted is in effect reduced by the magnitude of the arc drop, thereby reducing the circuit current. If the arc drop can be increased to approach or equal the source voltage, the current becomes very small or zero and the arc becomes unstable and extinguishes, thereby interrupting the circuit. Frequently, a magnetic field is used to stretch out the arc sufficiently to render it unstable so that it extinguishes.

In some relays, in order to avoid the problems associated with carrying a main current conductor on the moving arm of the relay, the relay is provided with a bridging contact which bridges a pair of fixed contacts which are connected to the main load terminals. With the bridging member disposed in physical contact with the spaced apart main contacts, the circuit is closed. Upon actuation of the relay to open the circuit, the shorting bar is retracted. As the shorting bar retracts, two gaps open in the load circuit, one between the first fixed contact and the shorting bar and a second one between the shorting bar and the second fixed contact. In such relays, arc extinction is accomplished in a manner similar to single contact-gap switches.

Piezoelectric bender relays have now been developed for use in communication and other circuitry. See, for example, U.S. Pat. No. 4,697,118 entitled "Piezoelectric Switch" by Harnden, Jr., et al. issued Sept. 29, 1987 and U.S. patent application Ser. No. 244,647 filed Sept. 13, 1988 as a continuation of U.S. patent application Ser. No. 103,753 filed Dec. 9, 1987 as a continuation-in-part of application Ser. No. 911,171 filed Sept. 24, 1986 by W. P. Kornrumpf, both incorporated herein by reference.

Most simple switches designed to operate with current loads up to 10 amps have gap lengths, when fully open, of a few millimeters or less. This includes both electromagnetically and piezoelectrically driven devices. Such switches are not considered useful in controlling DC power circuits because the voltage developed by the arc across the short gap spacing between fully open contacts is limited to contact voltage which usually is insufficient to limit current from say a 110 volt source to a level which can be interrupted.

Such devices are used successfully in low power AC circuits because the current periodically passes through sinusoidal zeros which allow interruption to occur. But even in this case, the arc drawn as the contacts part will in general persist until the end of the power half cycle causing contact erosion. Such erosion can be substantially reduced or even essentially eliminated if the current is depressed nearly to zero at the moment the contacts open. A switch capable of such current suppression regardless of the instant in a power half cycle at which the contacts open is the subject of the present invention.

OBJECTS OF THE INVENTION

Accordingly, a primary purpose of the present invention is to provide a switch capable of significant current reduction utilizing the short gaps provided by piezoelectric benders.

A further object of the present invention is to provide a device in which a multiplicity of operating gaps provides substantial voltage isolation in the open state.

A still further object of this invention is to provide a fast acting, compact switch.

SUMMARY OF THE INVENTION

In accordance with the present invention, the above objects are achieved by a switch which comprises more than two contact pairs permanently connected in series between the switch's first and second main terminals. Each of these contact pairs has a movable contact and an open position and a closed position. In one embodiment of the invention, the contact pairs are arranged in pairs with the movable contacts of two associated pairs arranged as a shorting bar which bridges the two fixed contacts of these associated pairs. The switch includes means for actuating the contact pairs between their open and closed positions. When all of the contact pairs are open, the breakdown voltage of the switch is the sum of the breakdown voltages of the contact pairs. Consequently, the switch can be fabricated to control a wide range of voltages in accordance with the number of contact pairs included in the switch.

In one embodiment of the switch, the movable contacts of all of the contact pairs are disposed on piezoelectric benders which are designed to operate in response to a single applied control signal in order to actuate the contact pairs together.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION

Figure 1:
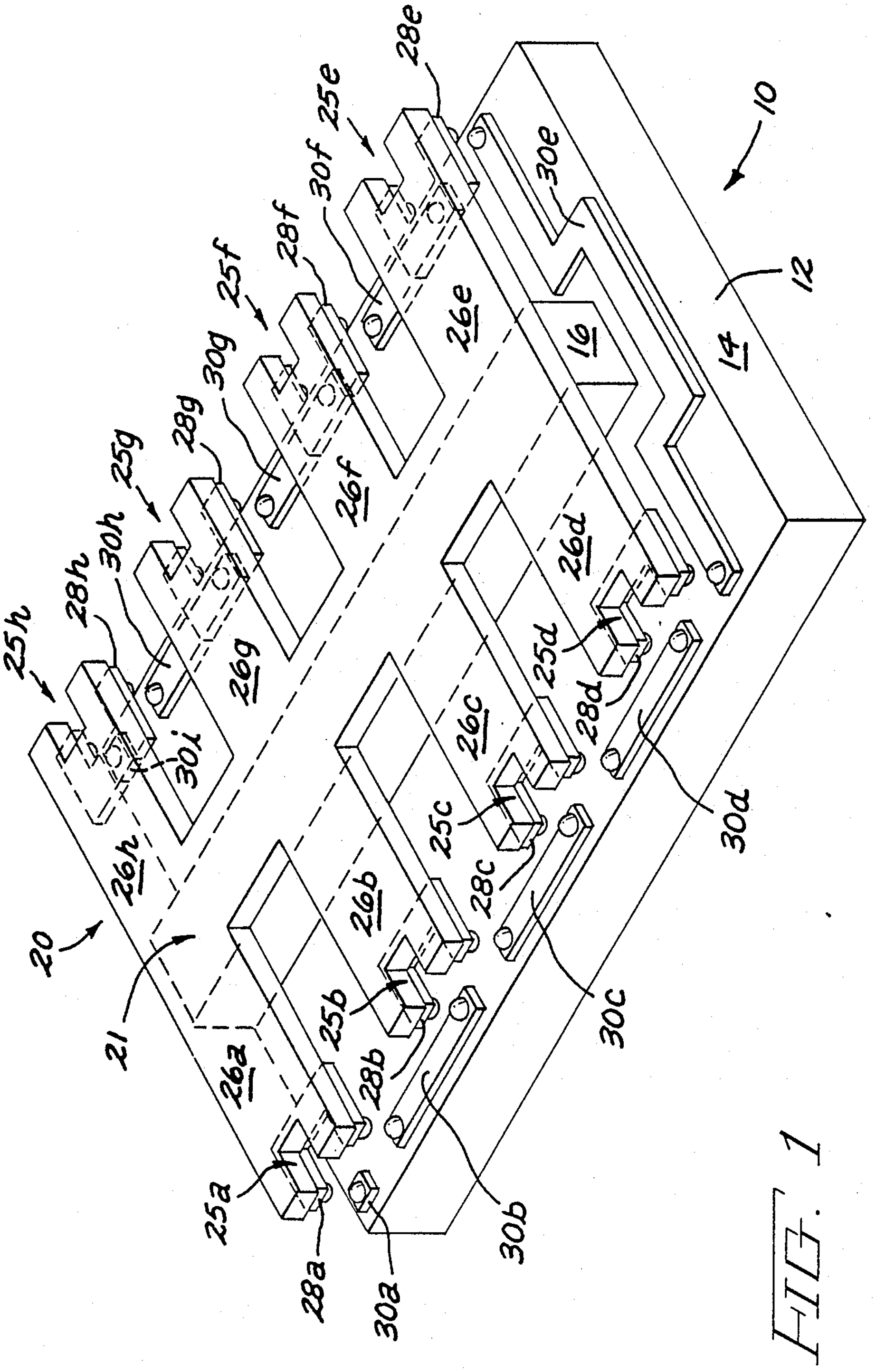
FIG. 1 is a perspective, schematic illustration of a preferred embodiment of the present invention.

FIG. 1 is a perspective, schematic illustration of a multi-gap piezoelectric switch 10, which in the particular configuration illustrated, has sixteen contact pairs connected in series. The switch 10 comprises a support structure 12 and a piezoelectric bender array 20. The support structure 12 comprises a support member 14 having a plurality of contact bars 30 thereon and a spacer member 16. The piezoelectric bender array 20 has a central spine or clamping area 21 and eight drive elements or bender fingers **26*a*–26*h* extending outward therefrom. The clamping area 21 of the bender array is disposed on the spacer member 16 and held there by clamping means which are omitted from the drawing for clarity. Each of the drive elements or fingers 26*a*–26*h* has a fixed end at the spine or clamping area of the structure and a free or movable end remote therefrom. This piezoelectric bender array is preferably of the sandwich variety as shown in detail in FIG. 2 where the bender array is shown upside down to reveal the details of the portion of the bender structure which is disposed toward support member 14 in FIG. 1. A central electrode or shim 22 is sandwiched between two piezoelectric layers 23 and separate outer drive metallizations 24*b* and 24*t* are disposed on the bottom and top outer surfaces, respectively, of the piezoelectric bender array 20. The piezoelectric material may be lead zirconate titanate which is commonly referred to as PZT or other piezoelectric materials as desired. With the central electrode layer 22 grounded and for a particular direction of polarization of the PZT, application of a large positive DC voltage to the top outer electrode 24*t* causes the bender to bend up while application of a large positive DC voltage to the bottom outer electrode 24*b*, causes the bender to bend down. Alternatively, electrode 22 may be omitted and one of the outer electrodes 24*b* and 24*t* may be grounded and the drive voltage applied to the other of the outer electrodes 24*b* and 24*t*. The outer drive metallizations 24*b* and 24*t* may be omitted along the portion of the spine which is used for clamping the bender array to the support structure 12 in order to avoid stressing the clamped portion of the piezoelectric. However, this not generally considered necessary. The clamp mechanism is omitted from the drawings for clarity. In switch 10, each of the electrodes 22, 24*b* and 24*t* is continuous throughout the comb structure of bender array 20 so that all of the fingers 26*a*–26*h*** are driven by the same drive signals to operate essentially simultaneously.

Figure 2:
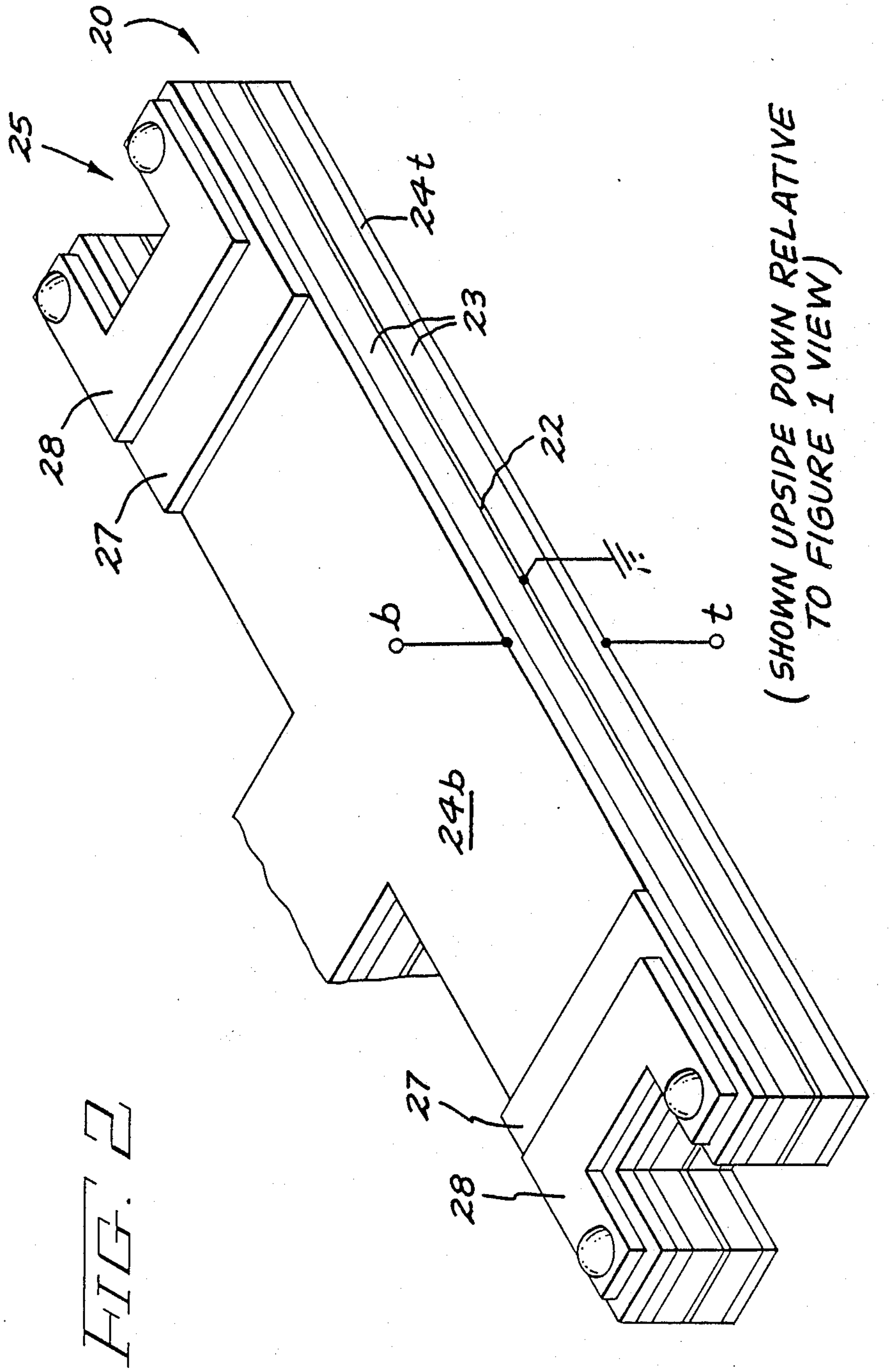
FIG. 2 is a detail of FIG. 1.

In FIG. 1, the bender array 20 is configured as a double-sided comb with the fingers **26*a*–26*d* extending from one side of the spine of the comb and the fingers 26*e*–26*h* extending from the opposite side of the spine. Each of the fingers 26 has a corresponding slot 25*a*–25*h* disposed therein which extends from the end of the finger toward the spine of the comb. The slots 25 serve to improve the compliance of the movable contacts at the ends of the fingers with the fixed contacts with which they are aligned. Alternatively, the slots may be omitted and compliance provided in the mounting of the "fixed" contacts. Each finger 26*a*–26*h* of the bender array 20 has a shorting bar 28*a*–28*h*, respectively, disposed at the free end thereof. The individual shorting bars 28 are U-shaped and extend from the end of the finger on one side of the slot 25, around the end of the slot and back to the end of the finger at the other side of the slot. These shorting bars 28 are disposed on top of an insulating layer 27 over the top of the bottom outer drive metallization 24*b* (FIG. 2). Each of the shorting bars 28** has a contact portion at the tip of each arm of its U-shaped configuration.

The contact portion of the shorting bar **28*a* which is disposed on the fork of the finger 26*a* which is leftmost in FIG. 1 is aligned with the fixed contact 30*a* disposed on the upper surface of the support member 14. This is the first contact pair in the series connection of contact pairs. Similarly, the contact portion of the shorting bar 28*a* which is disposed at the end of the fork of the finger 26*a* which is rightmost in the figure, is aligned with a leftmost contact portion of a contact bar 30*b* which is disposed on the upper surface of the support member 14. This is the second contact pair in the series connection of contact pairs. The contact bar 30*b* extends across the gap between the fingers 26*a* and 26*b* and has its rightmost contact portion disposed in alignment with the leftmost contact portion of the shorting bar 28*b* which is disposed on the finger 26*b*. This is the third contact pair in the series connection of contact pairs. The shorting bar 28*b* extends from its leftmost contact portion around the base of the slot 25*b* and up to the rightmost contact portion on the righthand fork of the finger 26*b* which is disposed in alignment with the leftmost contact portion of a contact bar 30*c* which is disposed on the upper surface of the support member 14. This is the fourth contact pair in the series connection of contact pairs. This pattern of shorting-bar-to-contact-bar alignment is continued around the entire structure to the alignment of the leftmost contact portion of the shorting bar 28*h* with the contact 30*i* disposed on the upper surface of the support member 14 which is the last (sixteenth) contact pair in the series connection of contact pairs. More or fewer contact pairs can be included in the series connection of contact pairs by increasing or decreasing the number of bender fingers 26 and contact bars 30**. Two or more shorting bars may be included on a single bender by making the bender wider.

Figure 3:
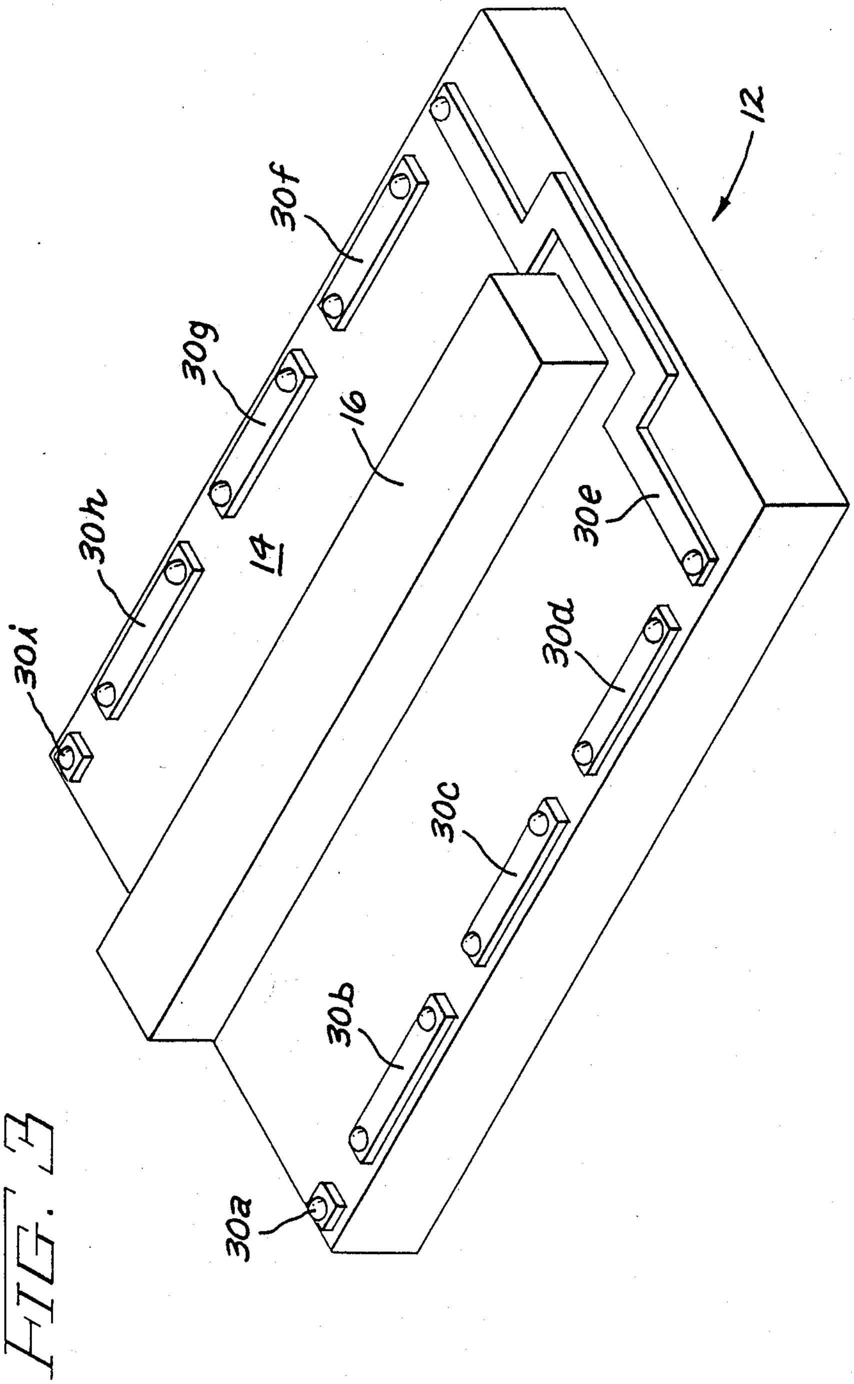
FIGS. 3 and 4 are perspective, schematic illustrations of two components of the FIG. 1 structure.
Figure 4:
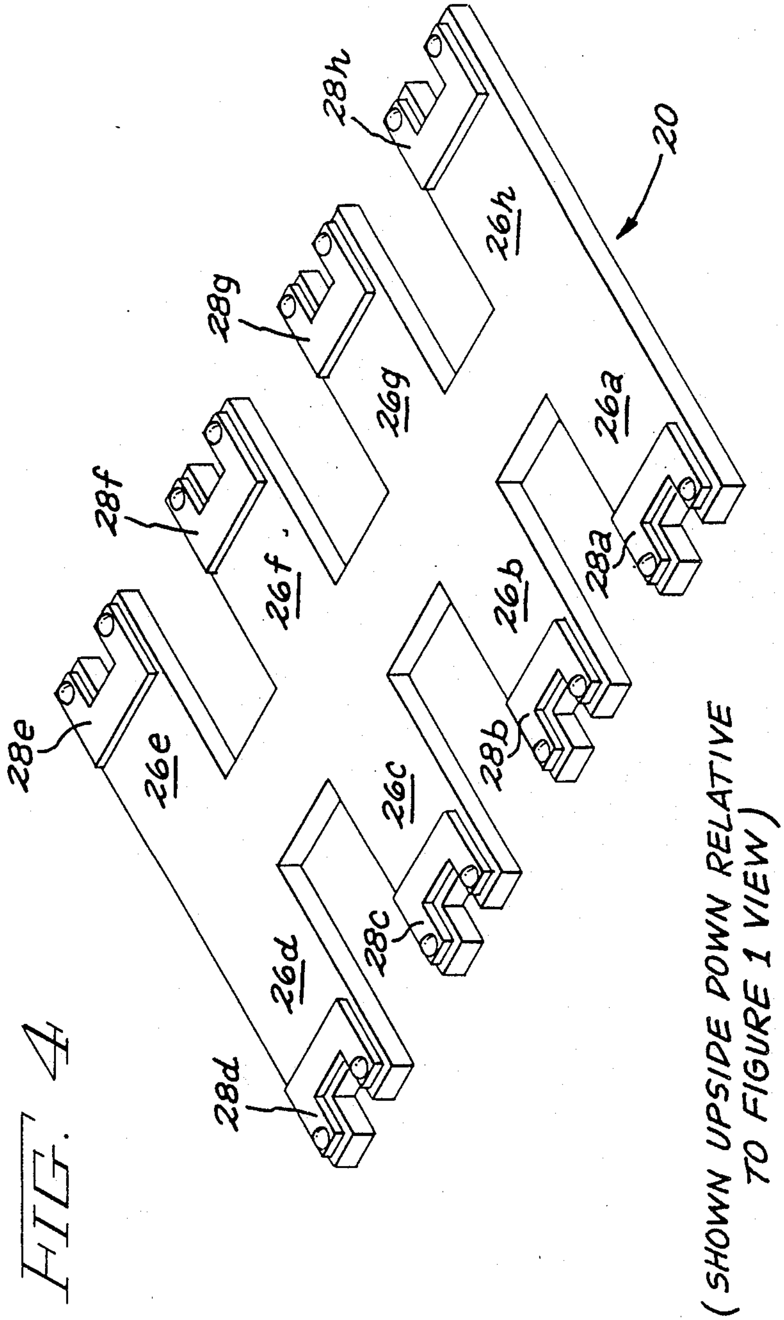

At the righthand end of the support member 14, the contact bar **30*e* has one end disposed in alignment with the rightmost contact point on the finger 26*d* on the near side of the spine of the comb and a second end disposed in alignment with the rightmost contact on the finger 26*e* on the far side of the spine 21 of the bender array 20. The configuration of the shorting bars on the piezoelectric bender array 20 and the contact bars on the support member 14 are shown more clearly in FIGS. 3 and 4. FIG. 3 is a perspective view of the upper surface of the support member 14 and FIG. 4 is a perspective view of the piezoelectric bender array 20** turned upside down. To assemble the structures shown in FIGS. 3 and 4 into the structure shown in FIG. 1, the structure of FIG. 4 is turned upside down on top of the FIG. 3 support member with the various contacts disposed in alignment as discussed above. The gaps in FIG. 3 between adjacent contact bars 30 are preferably made large enough to ensure that the arc voltage for an arc extending directly across that gap is greater than the sum of the two arc voltages for arcs extending between the aligned shorting bar 28 and contact bars on either side of the gap. Such a condition ensures that a stable arc across a gap on substrate 12 will not supplant a pair of unstable arcs extending between a shorting bar 28 and the contact bars 30.

The switch 10, as shown in FIG. 1, is a normally open, single pole, single throw switch. As an alternative to the normally open, single pole, single throw switch shown in FIG. 1, the relative heights of the various contacts can be adjusted so that with the bender in its unactuated position, the contacts are closed so that the switch is a normally closed single pole, single throw switch in which the bender is actuated to bend upward in order to open the switch.

The switch 10 of FIG. 1 is easily converted into a normally open, double pole, single throw switch merely be omitting the central portion of the contact bar 30*e* which extends from the near side of the spine to the far side of the spine in FIG. 1 and by then connecting the two, then separate, contact portions 30*e* to separate external contacts with the result that the moving contacts on the fingers 26*a*–26*d*, when actuated to a closed position, close a circuit between the contact 30*a* and the contact 30*e* on the near side of the spine and the fingers 26*e*–26*h*, when actuated to a closed position, complete a circuit between the contact portion 30*e* on the far side of the spine and the contact 30*i*. This halves the number of contact gaps in each of the two switches as compared to the switch actually shown in FIG. 1, but it enables both sides of a power line to be controlled by single switch.

Figure 5:
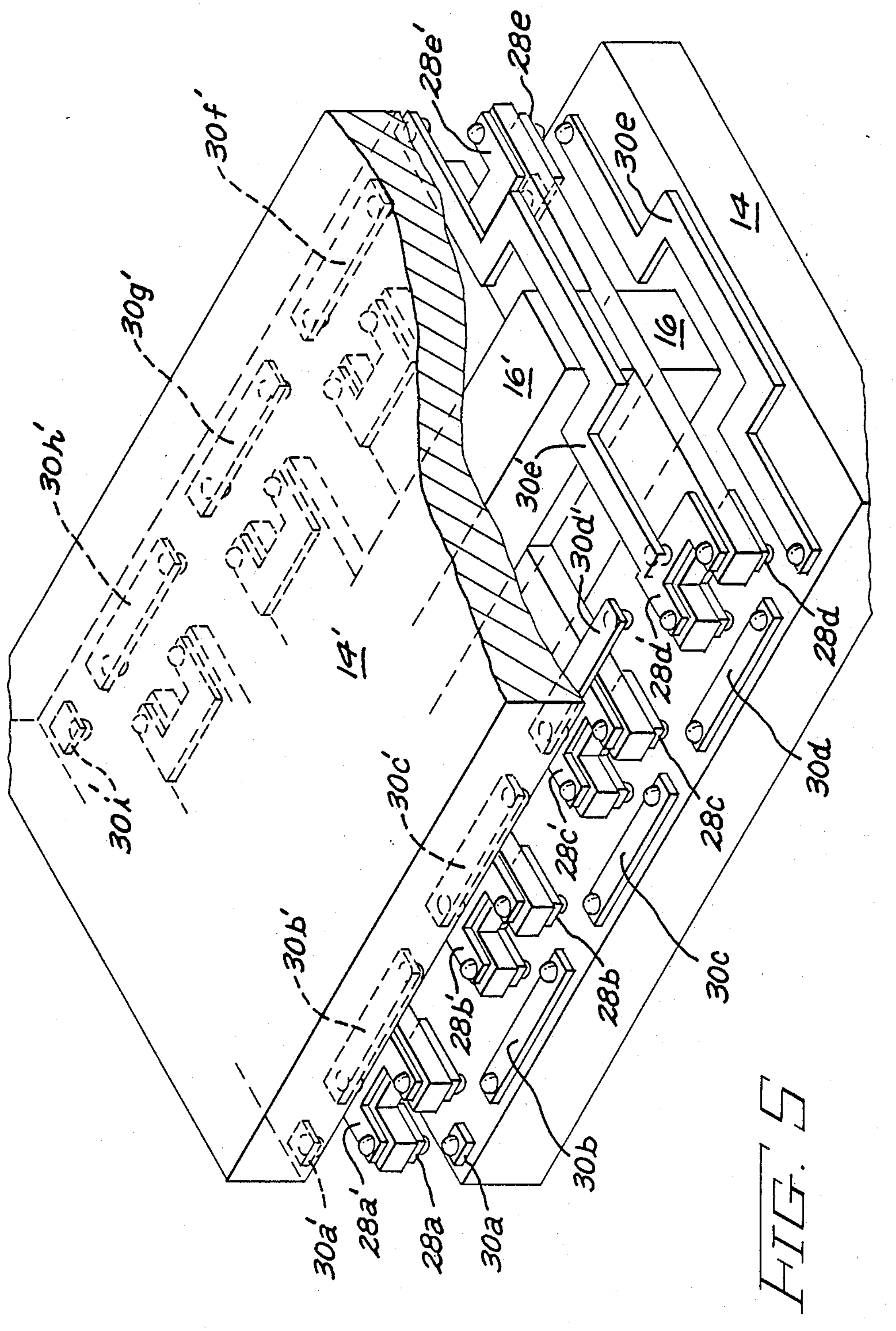
FIG. 5 is a perspective, schematic illustration of a modified version of the FIG. 1 embodiment.

A pair of single pole, single throw switches may be provided by a further modification of the switch 10. Such a dual single pole, single throw switch is shown at 10′ in FIG. 5. In FIG. 5, the structure of the switch of FIG. 1 is modified by adding shorting bars 28*a*′–28*h*′ on top of the fingers of the bender array and a second support structure 12′ which is similar to the structure 12, is inverted relative to the structure 12 and placed on top of the modified bender array 20′ with the contacts of its contact bars 30*a*′–30*i*′ disposed in alignment with the shorting bars 28*a*′–38*h*′. With this structure, a pair of single pole, single throw switches is provided in which only one of the switches may be closed at a time. In the unactuated position of the bender array 20′, both switches are open. By actuating the bender array 20′ to bend downward to close the contacts on the support member 12, the circuit connected across the contacts 30*a* and 30*i* is closed. Similarly, by causing the bender array 20′ to bend upward to close the contacts on support structure 12′, the circuit connected between the upper contacts 30*a*′ and 30*i*′ is closed. If it is desired to provide a single pole, double throw switch with a neutral center, then the contacts 30*a* and 30*a*′ may be connected together, thereby leaving the contacts 30*i* and 30*i*′ as the contacts to the two throws of the switch. If a double pole, double throw switch is desired, then the contact bars 30*e* and 30*e*′ may both be severed in the manner discussed above (with respect to modification of switch 10 of FIG. 1) and the contacts 30*a* and 30*a*′ are connected together and the contacts 30*i* and 30*i*′ are connected together.

Figure 7:
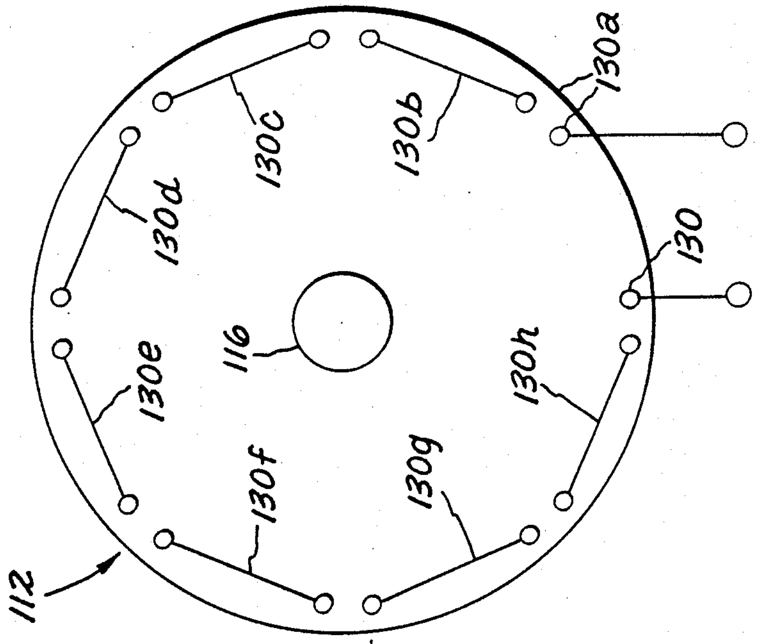
FIGS. 6 and 7 are schematic illustrations of two components of a further alternative embodiment of the invention.
Figure 6:
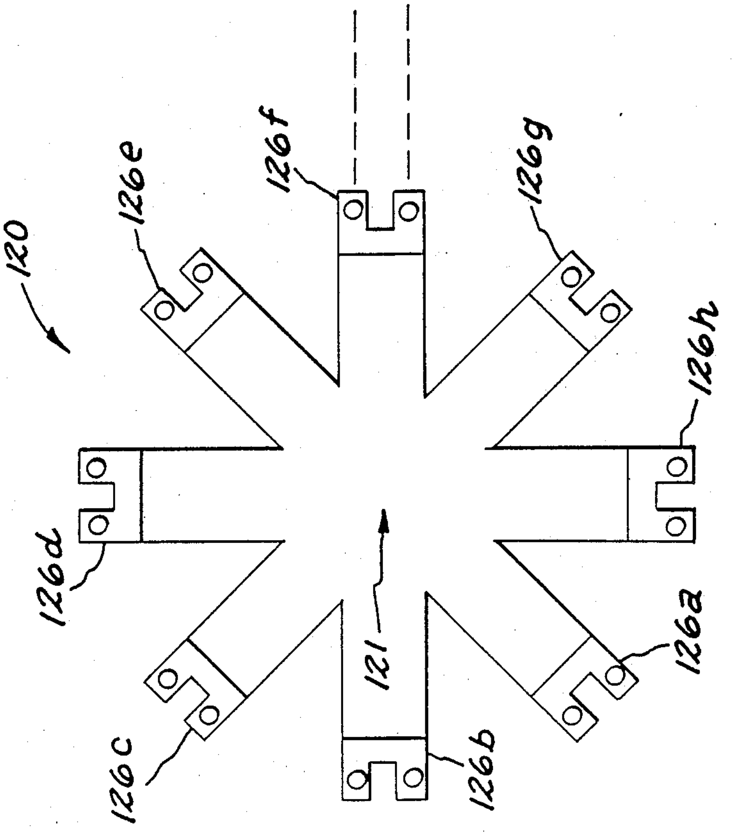

FIGS. 6 and 7 illustrate, in a schematic form, the bender and support member components of an alternative embodiment of a switch which is functionally similar to the switch of FIG. 1. In FIGS. 6 and 7, reference numerals in the 100's have been used. As between FIGS. 1 and FIGS. 6 and 7, reference numerals having the same final two digits are applied to similar structures or elements. Only those elements which have been changed significantly are discussed here since the functions and configurations of the other elements and structures will be readily understood by those skilled in the art. In FIG. 6, the bender array 120 is star or asterisk shaped in that its individual drive elements or fingers 126*a*–126*h* are oriented as radial rays extending from a central hub which serves as the clamping portion of the piezoelectric structure. Each of the drive elements or fingers 126*a*–126*h* has a fixed end at the center or hub of the array 120 and a free or movable end remote from that center or hub. The contact bars 130*a*–130*i* in FIG. 7 are arranged in a roughly circular pattern for alignment with the overlying contacts of the bender array 120. The structure of FIGS. 6 and 7 may be assembled to form a switch 110 by folding the paper midway between FIGS. 6 and 7 to fold the FIG. 6 structure over on top of the FIG. 7 structure. The FIGS. 6/7 embodiment of the invention is operatively similar to the FIG. 1 version in having sixteen contact pairs connected in series between the main terminals 130*a* and 130*i*. As with the FIG. 1 embodiment, the bender array may also be provided with shorting bars on both sides of the fingers to form a bender array 120′ and with a second support structure 112′ disposed above the bender array 120′ to provide switch structures similar to those discussed with respect to FIG. 5.

Figure 8:
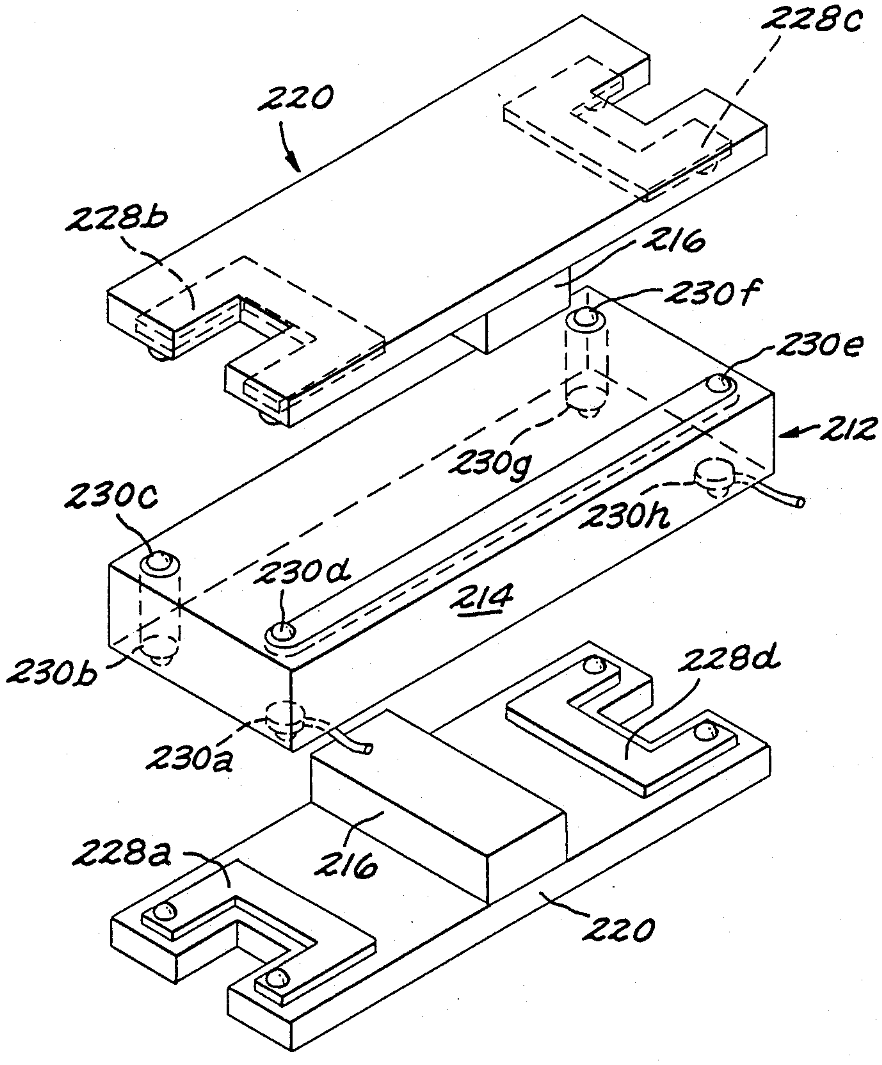
FIG. 8 is a perspective exploded view of a still further alternative embodiment of the invention.

In FIG. 8, a further alternative embodiment of the invention is shown in a perspective exploded view. Once again, reference numerals ending in the same two digits are applied to structures which are similar to those in FIG. 1. In this embodiment of the invention, a central support structure 212 is flanked by two separate benders 220 which are spaced from the support structure 212 by pedestals 216. Four contacts are arranged on each of the two major surfaces of the support member 214 with the contacts 230*b* and 230*c* connected together through support member 214. Contacts 230*d* and 230*e* are connected together along the surface of support member 214. Contacts 230*f* and 230*g* are connected together through support member 214. Shorting bars 228*a*–228*d* connect together contacts 230*a* and 230*b*; 230*c* and 230*d*; 230*e* and 230*f*; and 230*g* and 230*h*, respectively, when actuated toward support member 214. Thus, flexing of the two benders toward support member 214 closes a circuit extending between contacts 230*a* and 230*h*. In the structure of FIG. 8, only eight gaps are connected in series between the contact 230*a* and 230*h*. This halves the number of gaps connected between those contacts as compared to the FIGS. 1–7 embodiments of the invention. The number of contact pairs in the FIG. 8 structure may be doubled by widening the structure parallel to the length of the pedestals or spacers 216 and providing two separate shorting bars at each end of each bender and an associated set of contacts in the support member 214.

As is known to those in the switch art, the arc voltage of a contact pair for minimal contact spacing is dependent on the materials of which the contact is formed.

For most normal metals, this arc voltage is in the neighborhood of 15 volts, but increases to the neighborhood of 20 volts for refractory metal contacts. As a consequence, the minimum voltage at which an arc may be sustained across all of the contact pairs of the switch 10 is dependent on the metal used for the contact surfaces. All other things being equal, it is preferred to use refractory metal contacts for several reasons. First, the arc voltage is increased. Second, arcs are sustained for a shorter period of time with a consequent reduction in contact erosion even as compared to the slight to nonexistent erosion present with normal metal contacts.

In addition to the arc voltage associated with the contact materials, there is a component of arc voltage which depends on the length of the arc. In normal electrical switches, the contacts are drawn far enough apart that the overall arc voltage contains a contact-voltage component plus a length-of-the-arc component. However, that arc voltage for AC circuits is normally much less than the rated voltage for the switch. As a consequence, upon opening of the switch during the flow of current, an arc is established which is sustained by the current in the controlled circuit until the current in or the voltage across the arc reduces to a value at which the arc becomes unstable with the result that the arc extinguishes and is not re-established on the successive half cycle of the AC waveform. Switches in accordance with the present invention directly contrast with such prior art switches in that the sum of the contact arc voltages (the switch arc voltage) is sufficient to cause rapid current suppression. This switch arc voltage may be greater than the rated voltage of the switch, but need not be that large for effective switch operation, especially for AC circuits. As a consequence, the current in the controlled circuit is interrupted substantially instantaneously upon actuation of piezoelectric switch in accordance with this invention. The arc voltage need not equal or exceed the terminal voltage of the circuit to be interrupted, but rather may simply be high enough to cause the arc to become unstable and extinguish. Thus, for example, controlling a 110 volt AC signal, synchronous switching may be used in conjunction with the creation of a specific arc drop. By selecting a specific arc drop to be developed by multiple gaps, an associated time range within the power frequency half cycle during which opening of the contacts will cause the immediate suppression of current can be specified. For example, if the total arc drop developed by a given switch is 77 volts, current will be driven to zero with all contacts open if the opening occurs within ±30° of a sinusoidal zero. This means that if the contacts are driven or controlled by a synchronous circuit (with respect to which the time of opening is specified), a precision timing circuit is not required. The circuit might have a nominal setting of the sinusoidal zero, but as long as the contact opening occurs within ±30° of a sinusoidal zero crossing, current interruption will result. Since piezoelectric benders have low mass and respond quickly to a change in drive voltage, opening within ±30° of a zero crossing is quite feasible. Other limits on the timing of contact opening can be provided by changing the total arc drop of a switch either by changing the contact materials or the number of contact pairs connected in series. Instantaneous current cessation can provide beneficial effects, but is not normally a requirement for a switch such as the present invention which is intended for use as a switch rather than as an interrupter in response to detection of a fault. However, for fault conditions within the capabilities of this switch, it can be quite useful as an interrupter as well. Among the advantages of this switch over typical prior art switches is the high speed with which the piezoelectric bender contacts can open as a result of their extremely small moving mass. This allows better synchronization of the opening of the switch to a particular point in an AC power signal if such synchronization is desired. The series of gaps also provides a long life by ensuring that the individual contacts do not deteriorate as a result of operational stresses.

Where the switch is rated for a peak voltage $V_P$ and its contacts provide an arc voltage X per contact pair, it is preferred that the number of contact pairs N be at least equal to the largest even integer in $V_P/2X$. Alternatively, N can be the smallest integer for which $N \geqq V_P/2X$. Such an overall switch arc voltage ensures substantial latitude in the timing of the opening of the switch in an AC circuit while still ensuring that the resulting arcs will extinguish essentially immediately. To ensure that all arcs will extinguish immediately, even in a DC circuit, the number of contact pairs may be made equal to or greater than $V_P/X$.

It will be understood that since the normal operation of this switch is with all of the benders closing or opening their contacts at the same time, it is preferred that the control electrode pattern on the fingers 26 are all connected in common to the control terminals of the structure. Where a sandwich bender configuration is used, the central or shim electrode of the structure serves as ground for the control electrodes and separate terminals are provided for the upper and lower drive electrodes so that the direction in which the fingers bend is controlled by which of the outer electrodes the control voltage is applied to. While the piezoelectric fingers have been shown with slotted ends and with U-shaped shorting bars, it will be understood that plain fingers and straight shorting bars may be used if desired. Further, while we have chosen to illustrate this invention with the central electrode 22 grounded and the electrodes 24 excited, these connections may be reversed such that the electrodes 24 are grounded and the central electrode 22 is excited.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A switch comprising:

a first and second main terminals;

more than two contact pairs connected in series between said first and second main terminals, each of said contact pairs including a movable contact and having an open position and a closed position, said first main terminal being connected to said second main terminal by said switch if only if all of said contact pairs in said series connection are in their closed position, said contact pairs comprising a contact material which develops a contact voltage X in the presence of an arc, said series connection of contact pairs including at least $V_P/2X$ contact pairs where $V_P$ is the peak voltage said switch is rated to turn off; and means for actuating said contact pairs between their respective open and closed positions.

2. The switch recited in claim 1 wherein:
said contact pairs are ganged for operation together.

3. The switch recited in claim 1 wherein:
said means for actuating comprises a drive element having a fixed end and a movable end; and
said movable contact of at least one of said contact pairs is mounted on said drive element in the vicinity of said movable end thereof.

4. The switch recited in claim 3 wherein:
said drive element is a piezoelectric bender which bends in response to the application of a voltage thereacross; and
said switch further comprises a drive terminal for coupling a drive signal to said bender.

5. The switch recited in claim 4 wherein said switch includes a plurality of said piezoelectric benders with each piezoelectric bender carrying the movable contact of at least one contact pair.

6. The switch recited in claim 5 wherein:
said benders are of the sandwich type in which a central electrode spaces apart first and second layers of piezoelectric material and first and second outer drive electrodes are disposed on the outer surfaces of said first and second piezoelectric layers, respectively, whereby said bender can be driven in either of two opposed directions by applying a drive voltage between said central electrode and either said first or second outer drive electrode, respectively; and
said movable contacts of said contact pairs are mounted on said first outer surface of said bender.

7. The switch recited in claim 6 further comprising:
third and fourth main terminals;
a second set of more than two contact pairs permanently connected in series between said third and fourth main terminals, each of said contact pairs of said second set having an open position and a closed position and having a movable contact thereof disposed on said second outer surface of said bender whereby actuation of said bender in a first direction closes the circuit between said first and second main terminals and actuation of said bender in the opposite direction closes the circuit between said third and fourth main terminals.

8. The switch recited in claim 7 wherein:
said first and third main terminals are connected in common whereby said switch can function as a single-pole, double-throw switch.

9. The switch recited in claim 5 wherein:
the drive electrodes of said benders are connected in common.

10. The switch recited in claim 1 wherein:
there are at least $V_P/X$ contact pairs whereby the arc at each contact pair self-extinguishes upon opening of all of the contacts in said series connection, for any voltage less than or equal to said rated voltage.

11. The switch recited in claim 1 wherein:
said series connection of contacts includes at least M contacts whereby M is equal to $V_P/X$ when $V_P/X$ is an integer and otherwise is equal to the smallest integer which is larger than $V_P/X$.

12. The switch recited in claim 5 wherein all of said benders have their corresponding drive electrodes connected in common for actuation together in response to a drive signal.

13. A switch comprising:
first and second main terminals;
more than two contact pairs connected in series between said first and second main terminals, each of said contact pairs including a movable contact and having an open position and a closed position, said first main terminal being connected to said second main terminal by said switch when all of said contact pairs in said series connection are in their closed position and being disconnected from said second main terminal when any of said contact pairs in said series connection is in its open position;
means for actuating said contact pairs between their respective open and closed positions;
said switch being rated to handle a peak voltage of $v_P$ volts;
each of said contact pairs comprising a contact material which develops a contact voltage of X volts when said contacts arc upon opening; and
said series connection of said contact pairs including at least N contact pairs wherein N is the largest even integer in $V_P/2X$.

14. The switch recited in claim 13 wherein:
there are at least 2N contact pairs.

15. A switch comprising:
a support member;
first and second main terminals;
piezoelectric bender means having fixed and free ends, said fixed end being mounted on said support member;
more than two contact pairs connected in series between said first and second main terminals, each of said contact pairs having a movable contact and an open position and a closed position;
said movable contact of each contact pair being mounted on said bender means adjacent said free end thereof for movement therewith;
the other contact of each contact pair being mounted on said support member in alignment with said movable contact of that pair for closure therewith when said bender is in a first position;
said switch being rated to handle a peak voltage of $V_P$ volts;
each of said contact pairs comprising a contact material which develops a contact voltage of X volts when said contacts arc upon opening; and
said series connection of said contact pairs including at least N contact pairs wherein N is the largest even integer in $v_P/2X$.

16. The switch recited in claim 15 wherein:
said piezoelectric bender means has a comb-like configuration including at least two individual benders each having a fixed end at the spine of the comb and free ends remote therefrom.

17. The switch recited in claim 16 wherein each of said benders has the movable contacts of two contact pairs disposed thereon and connected together thereon whereby there are twice as many contact as benders.

18. The switch recited in claim 15 wherein:
said bender means comprises a plurality of individual bender fingers disposed in a star-like configuration with their fixed ends at the center and their free ends radiating therefrom.

19. The switch recited in claim 18 wherein each of said bender fingers carries the movable contacts of two different contact pairs thereon and those movable contacts are connected together thereon.

20. The switch recited in claim 15 wherein:

said bender means comprises a stack of elongated piezoelectric benders having their longitudinal centers fixed to said support means;

said benders are spaced apart by said support member; and said support member has fixed contacts disposed on opposed surfaces thereof in alignment with said movable contacts carried by said benders.

21. The switch recited in claim 15 wherein:

said series connection includes at least 2N contact pairs.

* * * * *